United States Patent [19]

Moschuering

[11] Patent Number: 5,151,652
[45] Date of Patent: Sep. 29, 1992

[54] MEASURING POSITION FOR MICROWAVE COMPONENTS

[75] Inventor: Hugo Moschuering, Hoehenkirchen, Fed. Rep. of Germany

[73] Assignee: Siemens Aktiengesellschaft, Munich, Fed. Rep. of Germany

[21] Appl. No.: 589,214

[22] Filed: Sep. 28, 1990

[30] Foreign Application Priority Data

Sep. 29, 1989 [EP] European Pat. Off. ........... 89118084

[51] Int. Cl.⁵ .............................................. G01R 1/02
[52] U.S. Cl. ............................... 324/158 P; 324/72.5; 324/158 F
[58] Field of Search ................ 324/725, 158 P, 158 F, 324/629, 637, 642; 333/33, 260

[56] References Cited

U.S. PATENT DOCUMENTS

| | | | |
|---|---|---|---|
| 3,201,721 | 8/1965 | Voelcker | 333/33 |
| 3,590,372 | 6/1971 | DeSantis et al. | |
| 4,056,777 | 11/1977 | Roch. | |
| 4,568,879 | 2/1986 | Nakamura et al. | 324/158 F |
| 4,707,656 | 11/1987 | Maryan | 324/158 F |
| 4,851,764 | 7/1989 | Usui | 324/158 F |
| 4,871,964 | 10/1989 | Bolt et al. | 224/158 F |
| 4,897,601 | 1/1990 | Hirsch et al. | 324/158 F |
| 4,943,767 | 7/1990 | Vokota | 324/158 P |
| 4,947,111 | 8/1990 | Higman et al. | 324/158 F |
| 4,961,050 | 10/1990 | Harwood et al. | 324/158 F |

FOREIGN PATENT DOCUMENTS

7233856 4/1974 France.

Primary Examiner—Kenneth A. Wieder
Assistant Examiner—William J. Burns
Attorney, Agent, or Firm—Hill, Van Santen, Steadman & Simpson

[57] ABSTRACT

A measuring position for a microwave component having a carrier (10) for the microwave component and having at least one test probe (5). The measuring position provides for non-destructive identification of the properties of microwave circuits on small substrate surfaces even when measuring quasi-planar circuits having connecting lines in asymmetrical microstrip line technology. The spatial position of the test probe (5) is variable and adjustable in three spatial directions relative to the spatial position of the carrier (10).

13 Claims, 5 Drawing Sheets

MEASURING POSITION FOR MICROWAVE COMPONENTS

BACKGROUND OF THE INVENTION

The present invention is directed to a measuring position for a microwave component, having a carrier for the microwave component and at least one test probe. The present invention is directed to an arrangement for measuring both analogue as well as digital, hybrid or monolithically constructed circuits in quasi-planar line technology having carrier materials (substrates) with an optimally small surface. For example, single semiconductor components such as, for example, housed or unhoused transistors, for example MESFETs, have a small surface, as do components such as hybridly constructed or monolithically integrated microwave circuits (MMIC) or combined arrangements such as chip-carrier structures.

In the prior art, the measurement of housed transistors has been performed with suitable measuring receptacles wherein the terminal bands of the transistors are contacted via planar line structures. Unhoused transistors have hitherto been tested in measuring mounts with a web. Due to the irreversible contacting by bond wire and solder, this measuring method is not non-destructive. Therefore, the measured transistors can generally not be re-used. The measurement of complete, monolithically integrated circuits of GaAs material likewise has the disadvantages recited for the measurement of unhoused transistors. This measurement is not non-destructive and is complex and is therefore suited neither for measuring individual components nor for measuring a great number of elements as necessary in the final testing during the manufacture of components.

There is a measuring position (Cascade Microtech, Inc.) for measuring planar circuits on a semiconductor wafer. This measuring position is equipped with test probes in coplanar line technology. The measurement of a component with this type of measuring probe requires a terminal configuration on the component in coplanar line technology (without base metallization) or requires through-contactings on the semiconductor wafer. A measurement of individual integrated circuits on the chip level or on the chip-carrier level with such a measuring position is only possible with additional measures.

SUMMARY OF THE INVENTION

The object of the present invention is to provide a measuring position for a microwave component, having a carrier for the microwave component and at least one test probe. It permits non-destructive identification of the properties of microwave circuits on optimally small substrate areas even for the measurement of quasi-planar circuits with connecting lines in asymmetrical microstrip line technology.

This object is inventively achieved by a measuring position wherein spatial positions of the test probe are variable and adjustable in three spatial directions relative to the spatial position of the carrier.

The spatial position of the carrier can be variable and adjustable in three spatial directions or the spatial position of the test probe can be variable and adjustable in three spatial directions. A means for automatic adjustment of the carrier and/or the test probe can be provided.

The test probe can be a coaxial line and a coaxial outer conductor of the coaxial line can press against the carrier.

The test probe can be designed to exert a mechanical pressure onto the microwave component. In one embodiment the test probe is rotatably seated via a hinge or joint. Furthermore, the test probes can be chronologically movable in arbitrary combinations. A means for direct testing of a semiconductor component can be provided within a microwave circuit. The test probe can have a multi-conductor structure. An integration of a network into the test probe can also be provided.

A measuring position of the present invention makes it possible that the dimensions of the circuits to be measured (dimensions of the substrate, dimensions of the semiconductor chip, dimensions of the chip carrier, etc.) for the measurement are limited in the direction toward low values only by the cross-sectional dimensions of the test probes employed.

The electromagnetic stray field, the emitted power and, thus, the electromagnetic coupling of the aperture fields is essentially defined by the cross-sectional dimensions of the test probes in comparison to the wavelength of the fundamental wave on the lines. The present invention makes it possible to use coaxial line test probes having an inside diameter of the outer conductor of less than 0.7 mm. Such values lead to an allowable, minimum distance of the apertures of the employed test probes of less than 1 mm, which defines the minimally allowable substrate surface in the measurement. A further miniaturization of the overall measuring arrangement as well as of the possible test subject can be carried out, so that spacings can be realized that allow a direct measurement of MMICs or of transistors.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
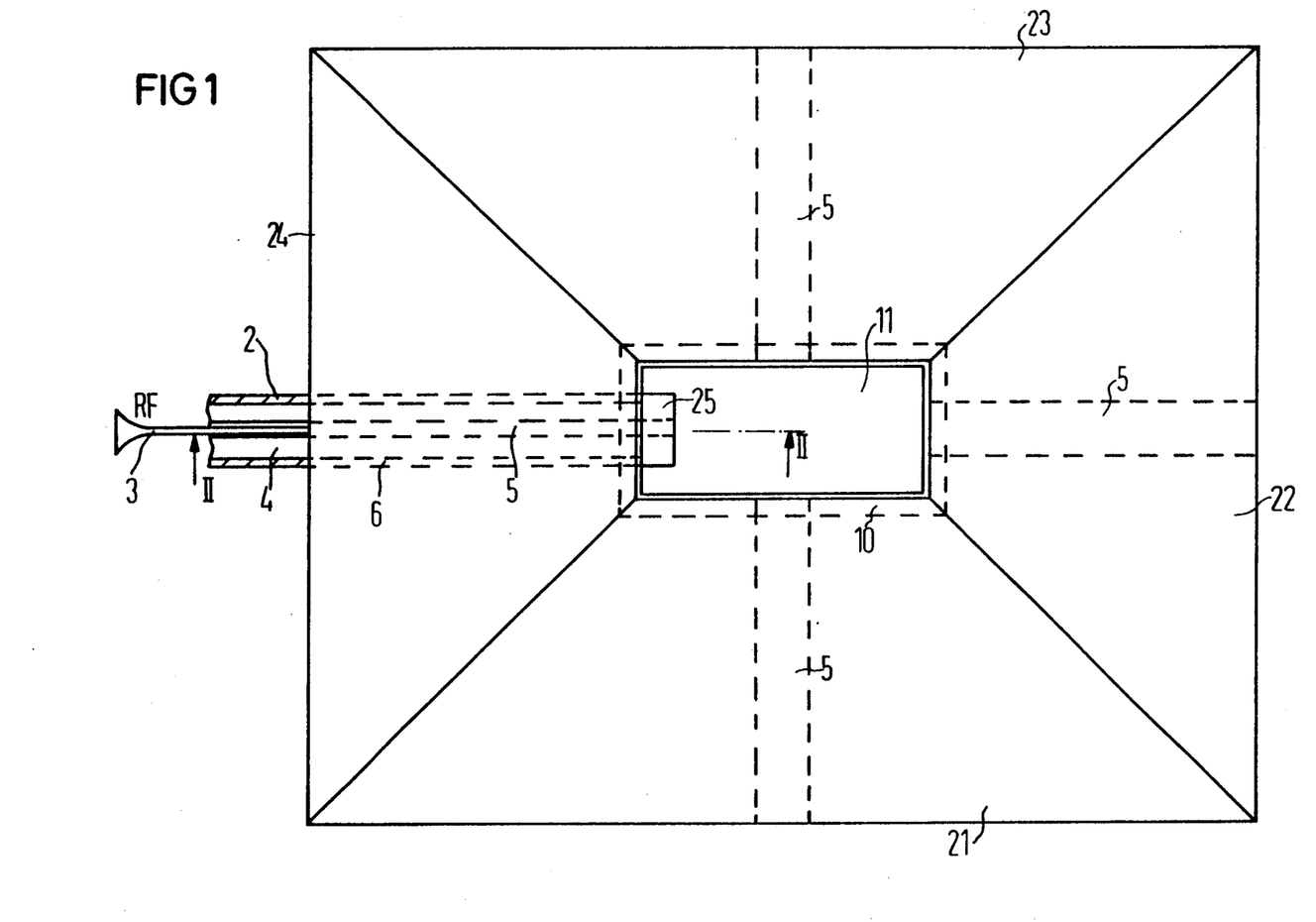
FIG. 1 shows a plan view of a four gate measuring mount.

FIG. 1 shows a plan view (fundamental arrangement) of a four-gate measuring mount including coaxial line-to-microstrip line junctions. In the center of the measuring mount, FIG. 1 shows the test subject (without an overhead conductor) with the substrate 11 that is connected to a measuring system of a conventional type, for example HP 8410/8510, via coaxial lines 5 (DC and RF) or test probes 5 (DC).

Using coaxial lines for the test probes 5, these coaxial lines comprise an outer conductor 2, an inner conductor 3 and a dielectric between outer conductor 2 and inner conductor 3, for example Teflon 4. Dependent on the application, the test probes have DC or RF feeds 6.

The test probes 5 serve the purpose of contacting test subjects having lines in coplanar and asymmetrical line technology whose miniaturization is enabled by the present invention. A measuring position of the present invention fundamentally has a bipartite type mechanical structure and enables the automatic adjustment of the overall arrangement. Among other things, miniaturized, open coaxial lines, for example solid jacket cables, are used as test probes 5. At their open end, these coaxial lines can have a nose 25, or only the inner conductor 3 can be conducted out of the coaxial line, so that either the nose 25 or the inner conductor 3 overlaps the surface of the substrate 11 in the plan view of FIG. 1. The nose 25 can be composed completely of Teflon 4 or the nose 25 can comprise a part of the outer conductor 2 and a part of the Teflon 4.

Structural details of the mechanical part of the measuring mount may be seen in FIGS. 2 through 5. With a design of the present invention, there is fundamentally the possibility of measuring circuits in microstrip line technology whose area is on the order of magnitude of the chip carrier arrangements to be tested. Such chip carrier arrangements can have dimensions of approximately $2 \times 5$ mm. In a measurement of the present invention, the circuits are neither modified nor destroyed, so that they are available for the intended use after the testing (non-destructive measurement in the microwave range). It is thus not only possible to make spot checks of production batches, but it is possible to test any manufactured circuit that is to be used. FIGS. 2 through 5 each respectively show at least a part of the cross section of a measuring arrangement of FIG. 1. In particular, FIGS. 2 through 5 illustrate the junction between the test probes and the microstrip lines on the test subject. This junction can be executed with a miniaturized coaxial line having a solid jacket. A semi-rigid line can be used as the coaxial line, for example UT 34 having an inner conductor diameter of 0.200 mm and an inside diameter of the outer conductor of 0.66 mm. The inner conductor 3 is pressed onto the overhead conductor of the microstrip line on a substrate 11 by the projecting nose 25 of outer conductor/Teflon. The substrate 11 can be composed of $Al_2O_3$ ceramic having a thickness of 10 mil and an overhead conductor width of a 50 ohm line of 0.248 mm. The outside of the coaxial outer conductor 2 can thereby lie on the carrier base plate 10. The carrier base plate can be composed of CuMoCu. The end faces in the aperture plane of the open coaxial line thereby press flush against the edge of the substrate 11.

The chip-carrier arrangement is held and adjusted by alignment pins 9 in the back side of the carrier base plate 10. The carrier base plate 10 can be additionally fixed by a mount (carrier holder) 8. The carrier holder 8 can be composed of Teflon. Teflon is a registered trademark. The miniaturized coaxial lines 5 have their cross-sectional dimensions selected such that, first, an electromagnetic coupling of the two aperture fields is prevented on the basis of the relatively small substrate dimensions and such that, a matching of the characteristic impedance and field line pattern of the two line forms is guaranteed. The difference between the radius of the inner conductor and the outer conductor of the coaxial line should therefore approximately correspond to the height of the substrate 11 in order to avoid additional matching networks. The coaxial line 5 can be arranged at an angle relative to the base area of the carrier in order to improve the contact between microstrip lines and test probes.

A design inclined by an acute angle is suitable in order to diminish the electromagnetic reactants of the walls of the measuring mount. The surface of the measuring mount should thereby be coated with a suitable attenuation material.

For inner conductors 3 having small cross-sectional dimensions, the nose 25 or an additional mechanism, for example an alignment pin 9 or a holder 8 of dielectric material having low permittivity is provided in order to guarantee the adjustment needed for a reproducible contacting between test subject and test probes. The test probes 5 whose nature and number can vary depending on the test subject and contacting (DC and RF) are mounted in common or individually on one or more mounts. The test probes are seated resiliently and resist twisting in a longitudinal direction. The transition from the test probes to the further measuring system occurs on the basis of suitable coaxial arrangements.

The significant stray field at the open end of the test probes 5 propagates in a volume region whose radius corresponds to approximately 2–3 times the inside radius of the outer conductor 2. The minimum distance of the test probes is defined as a function of the position of the test probes relative to one another. It is thereby respectively assumed that the wavelength of the fundamental wave in the coaxial line 5 is far greater than all cross-sectional dimensions and that the inner conductor or, respectively, overhead conductor of the test probes has only such a length, beyond the aperture plane of the test probe, that is extremely small in comparison to the wavelength of the fundamental wave in order to avoid additional emission in this region. This condition, however, is always met given the intended application of the measuring mount and in the planned frequency range up to 18 GHz and above 18 GHz, since the thickness of the substrate approximately corresponds to the difference between inner conductor radius and outer conductor radius of the coaxial line 5 in order to guarantee a matching of resistance and field pattern in the junction region between test subject and test probe. For solid materials, the measuring arrangement can be miniaturized or, respectively, enlarged proportionally to the operating frequency (assuming no losses) without influencing the properties of the arrangement. Only an approximately constant influence of the mechanical manufacturing tolerances thus must still be taken into consideration.

The basis for a measuring position of the present invention can be a conventional probe measuring position that is rebuilt in the fashion of the present invention. A microscope can be used with which the adjustment of the test subject, i.e. the adjustment of the overhead conductor 26 on the test subject and the inner conductor 12 of the coaxial line, can be checked. The horizontal motion (x-z direction FIG. 2) occurs, for example, manually with the assistance of a micrometer screw or occurs computer-controlled via a corresponding support; the vertical (y-direction) motion occurs with a suitable arrangement. Additionally, the coaxial lines can be resiliently moved in a z-direction but protected against twisting. The properties of the junction between coaxial line 5 and microstrip line can thereby be improved. The contacting of the test subject occurs in the RF or HF range and in the DC range via the coaxial lines 5 or in the DC range via standard test probes 5 insofar as these test probes 5 do not deteriorate the function of the test subject. The measuring arrangement is suitable for implementing complete, error-corrected ("on carrier", "on chip" calibration), vectorial measurements at circuits on an optimally small substrate surface.

Figure 2:
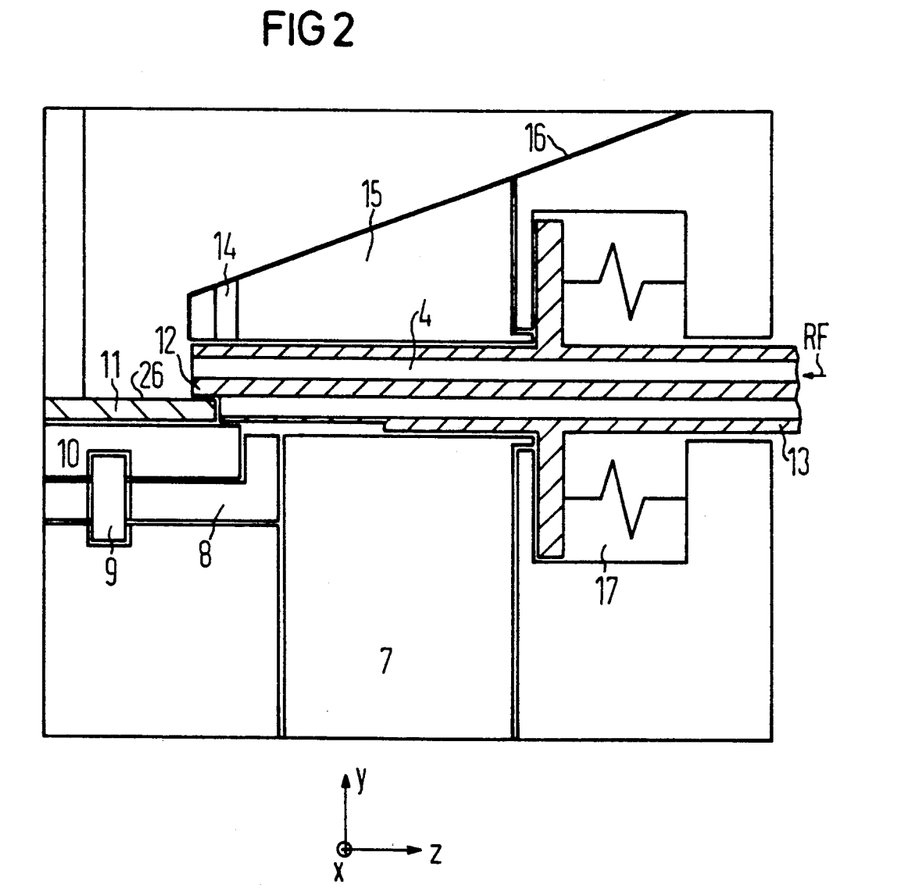
FIG. 2 shows a partial section through a measuring mount of FIG. 1.

FIG. 2 shows an anti-twist cable layout 17 having replaceable cables. The replaceable cables are resiliently arranged in a longitudinal direction. The measuring mount 15 has an alignment pin 14 in order to provide a contact pressure of the coaxial inner conductor 12 on the overhead conductor 26 of the substrate 11. The measuring mount 15 has a damping material 16 on its surface. The coaxial cable has a SMA connection 13 and the measuring arrangement of FIG. 2 has a platform 7.

Figure 3:
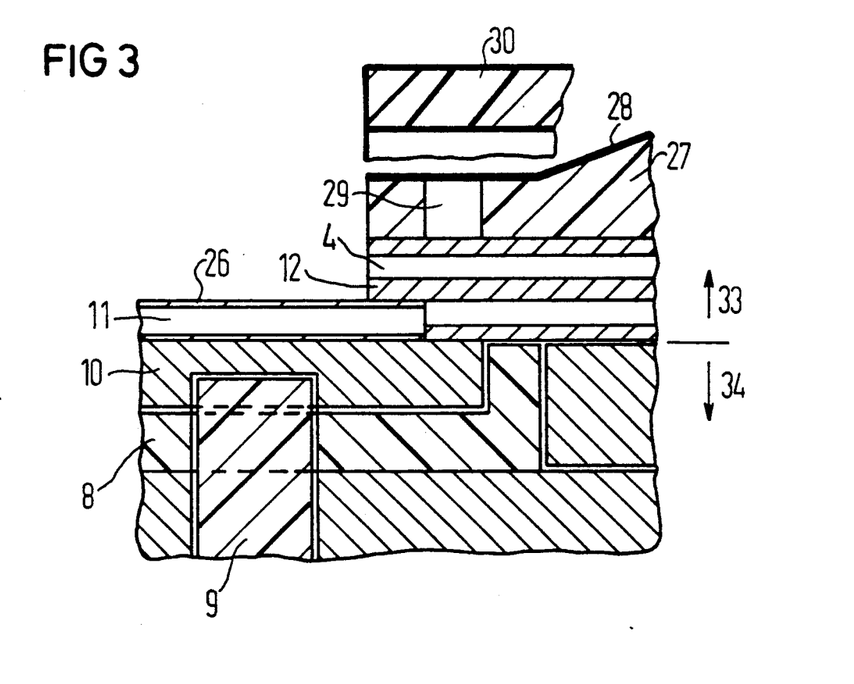
FIG. 3 shows a cross-section through a part of a measuring mount.

FIG. 3 shows a cross section through a part of a measuring mount similar to the measuring mount of FIG. 2. It can thereby be clearly seen that the alignment pin 9 serves the purpose of adjusting the chip carrier 10. The measuring mount 27 has a resistance layer 28 on its surface. The pressing mechanism 29, 30 that comprises an alignment pin 30 of, for example, Teflon and an alignment pin 29 that is arranged inside the measuring mount 27, serves the purpose of fixing the coaxial line 5 and of pressing the coaxial inner conductor 12 of this coaxial line 5 onto the overhead conductor metallization 26 on the substrate 11.

The arrangement of FIG. 3 has an upper part 33 and a lower part 34. The upper part 33 is composed of the probe structure and of the upper part of the measuring arrangement. The lower part 34 of the measuring arrangement is arranged on the platform 7 of the probe measuring position.

Figure 4:
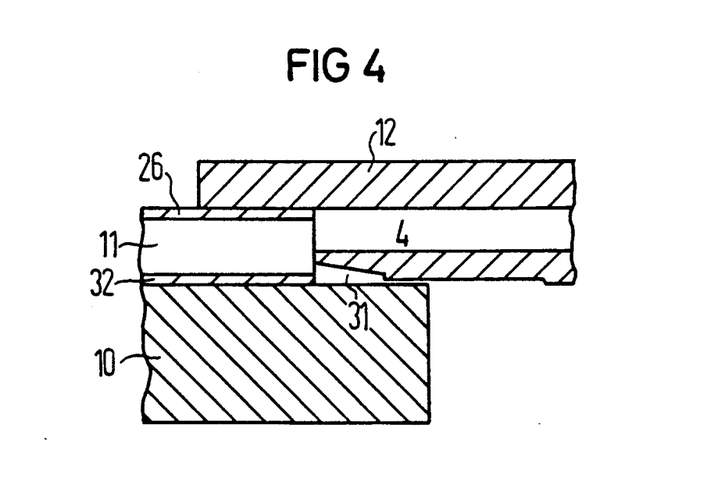
FIG. 4 shows a section through a part of a measuring mount.

In cross section, FIG. 4 shows a further possibility for a junction between a coaxial line and a microstrip line. The coaxial inner conductor 12 contacts the overhead conductor metallization 26 on the substrate 11. The underside of the substrate 11 can have a metallization 32. An electrical contact between the substrate metallization 32 and the outer conductor of the coaxial line is produced via the outer conductor-to-ceramic contact 31. The length of the modified area 37 is small compared to the wavelength to minimize its electrical influence.

Figure 5:
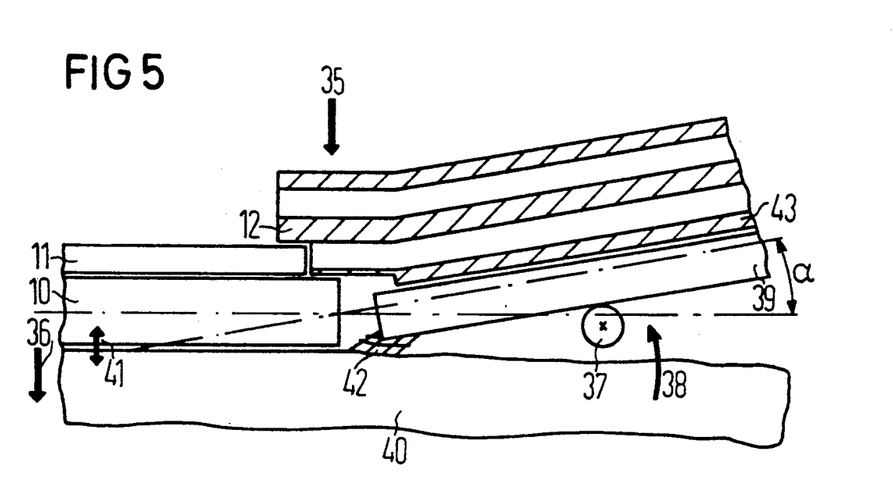
FIG. 5 shows a section through a part of a measuring mount.

FIG. 5 shows a further version of the pressing mechanism between the test probe and the test subject. The inner conductor 12 and the outer conductor 43 of the coaxial line are pressed onto the chip carrier arrangement 10, 11 in that the second part of the measuring mount 39 is angularly arranged. This second part of the measuring mount 39 is adjustably arranged in order to be able to set the mechanical pressure of the coaxial line against the test subject at the beginning of a measurement. The chip carrier arrangement 10, 11 is thereby resiliently seated in the direction of the arrows 41. The first part of the measuring mount 40 is also resiliently fashioned in the direction of the arrows 41. The first part of the measuring mount 40 and the second part of the measuring mount 39 are provided with hinges or joints 42 at a suitable location. The bending point thereby occurring between the first part of the measuring mount 40 and the second part of the measuring mount 39 is shown exaggerated in FIG. 5 in order to illustrate this principle.

The pressing direction in which the coaxial line is pressed against the test subject is referenced 35. A tensile direction 36 derives for the measuring arrangement of FIG. 5. The measuring arrangement of FIG. 5 has a rotatable fastening 37 around which the second part of the measuring mount 39 can be rotated in the direction 38.

Figure 6:
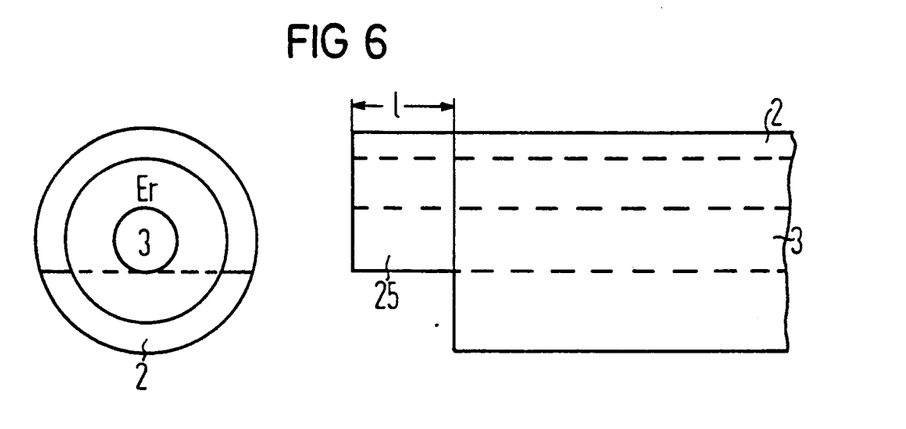
FIG. 6 depicts the aperture region of the coaxial line test probe for test subjects having coplanar connecting lines.

FIG. 6 shows the aperture region of coaxial test probes 5 when the test subject comprises a connecting line in coplanar line technology. The length L of the nose 25 can be variably adapted to the respective test subject. The aperture region of coaxial test probes is shown in FIGS. 2 through 5 for test subjects having connecting leads in asymmetrical microstrip line technology.

Figure 7:
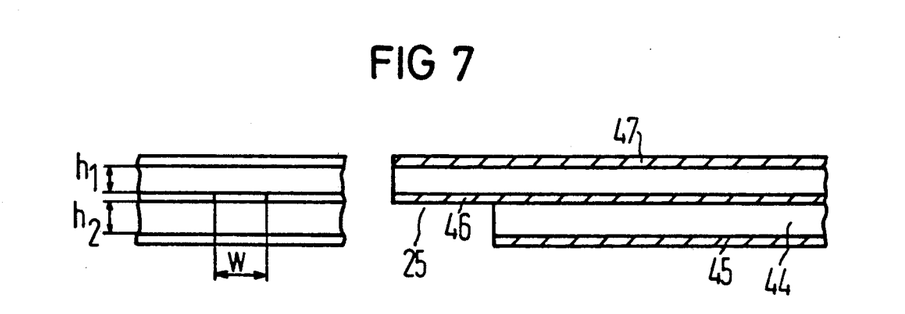
FIG. 7 shows a microstrip line test probe.

FIG. 7 shows the overall arrangement of a planarly constructed test probe. This test probe is composed of a basic structure of carrier material and base metallization 45 onto which a further dielectric layer 44 with the upper conductor 46 is applied. The overall structure of this test probe may be shielded under certain circumstances by a further metallization 47. The overall structure of the test probe can comprise a nose 25. The right-hand part of FIG. 7 is a section through the center of the left-hand part of FIG. 7. FIG. 7 shows a microstrip line test probe for test subjects having connecting lines in asymmetrical microstrip line technology. In modified form, such a microstrip line test probe is also suitable for a test subject having connecting lines in coplanar line technology.

For use of a test probe in microstrip line technology, the junction to the measuring system occurs via a suitable microstrip line-to-coaxial line junction. The test probes can be movably seated similar to the test probes of FIGS. 2 through 5.

Test probes can be manufactured in coplanar or asymmetrical microstrip line technology or in triplet technology with respectively slight modification of the basic structure of FIG. 7.

Independent of use in the measuring arrangement, the test probes are suitable for measuring integrated circuits on a chip level that are firmly implemented in a hybrid constructed circuit.

As a result of the double line structure, these structures can be used in a broad frequency range beginning with a frequency of zero.

Figure 8:
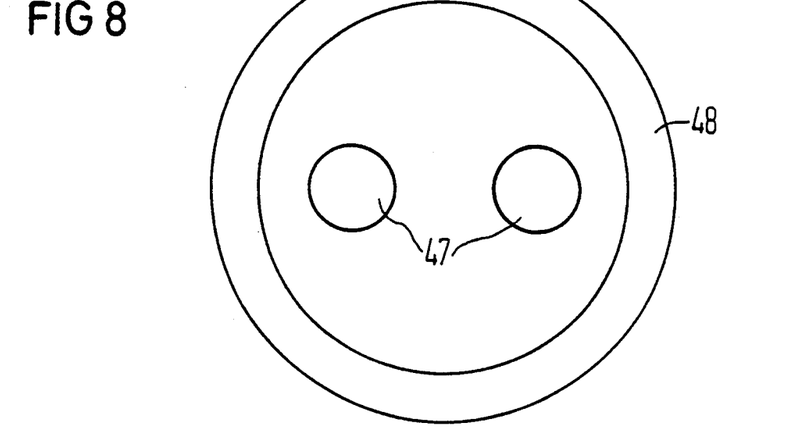
FIG. 8 shows a cross-section through a shielded double line system.
Figure 9:
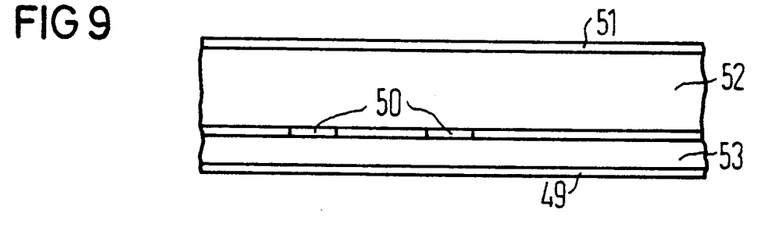
FIG. 9 shows a cross-section through a planar multi-conductor structure.

FIGS. 8 and 9 shows multi-conductor structures wherein the test probes 5 comprise a plurality of inner conductors.

FIG. 8 shows a cross section through a shielded double line system (three-conductor arrangement) having two inner conductors 47 and one outer conductor 48. FIG. 9 shows a cross section (aperture region) through a planar multi-conductor structure having a base metallization 49, a plurality of overhead conductors 50, a shielding 51 and two dielectrics 52, 53.

Figure 10:
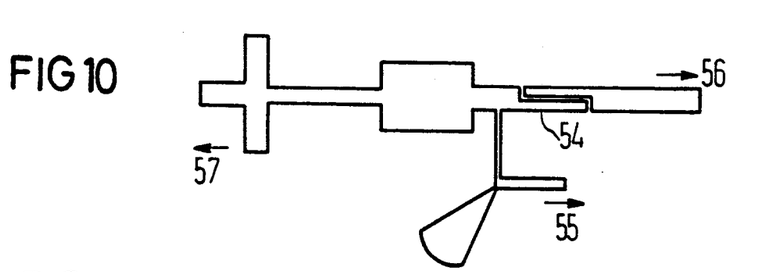
FIG. 10 shows a conductor structure of an adapted test probe.
Figure 11:
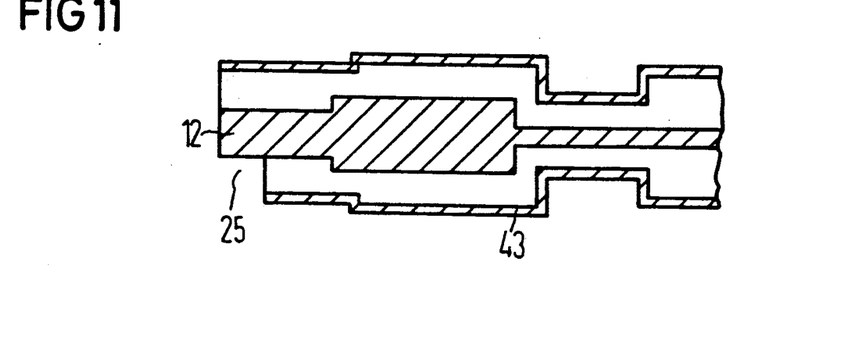
FIG. 11 shows a longitudinal section through a filter or matching network in coaxial line technology.

FIGS. 10 and 11 show coaxial and planar filter structures. Networks can be integrated into the test probes 5, for example, for decoupling radio-frequency power, for matching, attenuation and filtering of harmonics or the like. Corresponding networks can also be applied on the test subject holder. FIG. 10 shows an overhead conductor structure of an adapted test probe 5 with DC blocking capacitor 54 and DC supply 55 in planar line technology. The arrow 56 points to the measuring system and the arrow 57 points to the test subject.

FIG. 9 shows schematically a longitudinal section through a filter or matching network in coaxial line technology. The test probe of FIG. 11 has an inner conductor 12, an outer conductor 43 and a nose 25. The measuring arrangement of the present invention can be composed of two parts for every junction between the test subject and measuring mount, these two parts being connected to one another via a hinge or joint (FIGS. 2 through 5). The first part is composed of the test subject carrier that is the same for all test probes and is composed of the further, lower part that is movable in the three spatial directions (x, z; continuous motion; y; two conditions).

The second part is composed of the mount for the respective test probe and of the overall, upper part that is either manufactured of a material that has optimally few reactances onto the operating properties of the measuring arrangement or that is coated with a suitable damping material.

The test probe is rigidly connected to the second part. The base plate 10 of the test subject carrier has an electrical contact with the base metallization 32 of the quasi-planar circuit on the shortest path.

The mount 8 of the test subject carrier is composed of a material whose properties have optimally few reactances onto the operating behavior of the arrangement, for example of a dielectric having a low value of the permittivity factor that is also coated with a suitable damping or attenuation material. The test subject can be exactly fixed on the basis of additional measures such as, for example, alignment pins 9 in the carrier base plate 10. The test subject carrier is resiliently seated in order, first, to guarantee an improved contacting of the junction between the test subject and test probe and, second to guarantee a junction having constant pressing power (spring constant). The test subject carrier can be moved in the x-z plane and can also be moved in the y-direction by computer-controlled with the assistance of a coordinate table, for example corresponding to an adjustment rule.

Respectively one measuring mount 21 through 24 is movably arranged with respect to the test subject per test probe 5 in FIG. 1. In combination with the mobility of the test probes 5 in a longitudinal direction of these test probes and via a further hinge or joint in combination with the resilient holding of the test probes and test subject, the movable seating of the two parts of the measuring arrangement of the test probes 5 via a hinge or joint at a location that does not influence the operating behavior of the arrangement, guarantees optimum contacting in the region of the junction of the test subject line and the respective test probes 5 in their aperture region on the basis of manual or automatic motion of the arrangement in y-direction. A test subject line can thereby be an asymmetrical microstrip line or a coplanar line with/without base metallization. Over and above this, the mechanically uncoupled allocation of the two parts of the measuring arrangement is also possible. Both arrangements enable a reproducible, fast and computer-controlled adjustment. A microscope (manual adjustment) or an electrical signal that can be derived from the reflection or transmission behavior of the circuit, from a reference structure in common on the test subject or on the test subject holder or from the output signal of a suitable, conventional means (automatic adjustment) serves for monitoring the adjustment of the inner conductor of the coaxial line or, respectively, of the overhead conductor of planar test probes on the overhead conductor of the planar line of the test subject. This electrical signal need not necessarily be derived from the behavior of a planar structure in the microwave range. Optical or electronic means of a conventional type are also suitable for this purpose. The reflection or, respectively, transmission behavior of a microstrip line dependent on the adjustment or on the excitation behavior of a resonant structure can, for example, be utilized for this purpose in the microwave region.

A measuring arrangement of the present invention can be part of a conventional, computer-controlled measuring system for identifying the analogue or digital electrical behavior of the test subjects (for example, network analyzer, TDR measuring position, noise measuring position or the like). This combination of measuring system and mechanical measuring arrangement with computer-controlled adjustment of the test subject permits nondestructive, completely computer-controlled and error-corrected (calibration method) measurement of quasi-planar circuits on small substrate surfaces.

The present invention provides a reproducible contacting, low wear of the test probes, automatic control of the adjustment procedure for small cross sectional dimensions of the test probes and for small overhead conductor width of the microstrip lines on the test subject and also allows measuring events in a short time period. Also in a manually implemented measurement the present invention allows a fast changing of the test subjects and employment in series measurement.

An automatic adjustment is advantageous for extremely small widths of the overhead conductors (correspondingly low thicknesses of the substrate 11).

Below a certain width of the overhead conductor of the test subject, it is advantageous to use a test probe in planar technology. The manufacturing tolerances of the coaxial test probes, have a greater influence on the electrical behavior with increasing miniaturization, characterized by the characteristic line impedance and the wavelength constant of the fundamental wave. Added thereto is the behavior of the junction from the test probe to the measuring system (voltage standing wave ratio on the line). In the present invention, the contacting between test subject and test probe occurs either by the movement of the test probe, by the movement of the test subject holder or by movements of the test probe and the test subject holder in a bipartite arrangement per test probe, this bipartite arrangement according to FIGS. 2 through 5 being mechanically coupled or mechanically uncoupled.

The test probes can comprise a nose 25. A pressing mechanism provides adjustment of the coaxial inner conductor or, respectively, of the overhead conductor of a planarly constructed test probe. The contact pressure of the test probes against the lines of the test subject can be very precisely defined, for example by defined weights or spring constants that take affect at a suitable location at the bipartite mechanism.

All test probes can be moved independently of one another, can be moved in groups or can all be moved in common.

The test probes serve the purpose of contacting beginning at zero frequency.

Conventional test probes as known from probe measuring positions can also be utilized in the measuring arrangement insofar as they do not measurably influence the behavior of the circuit.

Independently of the employment in the proposed measuring arrangement, the test probes and their mounting and adjustment can also be used for direct testing of integrated circuits and chip arrangements within an overall circuit, for example GaAs chip arrangements on through-contactings or chip carriers.

A criterion for the automatic control of the adjustment procedure and of the measuring procedure can be derived from the measured signals at the test subject or at a reference subject. The automated adjustment of the test subject or of the test probes (separately or in common) derives therefrom. The reference structure can be mounted on the test subject or on the holder of the test subject. The control signal for moving the arrangement can be acquired with optical or electronic networks or with mechanical devices.

The present invention provides the contacting between the test subject and test probe with the assistance of a bipartite mechanical arrangement for every junction between test subject and test probe.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Measuring position for a microwave component, having a carrier for the microwave component and at least one test probe, comprising spatial positions of the at least one test probe being variable and adjustable in three spatial dimensions relative to a spatial position of the carrier, at least the one test probe being variable and adjustable in three spatial dimensions, and the at least one test probe having a structure for exerting mechanical pressure onto the microwave component such that a nose of the at least one test probe substantially contacts the microwave component.

2. Measuring position according to claim 1, wherein the spatial position of the carrier is variable and adjustable in three spatial dimensions.

3. Measuring position according to claim 1, wherein said measuring position further comprises a means for automatic adjustment of at least one of the carrier and the at least one test probe.

4. Measuring position according to claim 1, wherein the at least one test probe has the form of a coaxial line.

5. Measuring position according to claim 4, wherein a coaxial outer conductor of the coaxial line presses against the carrier.

6. Measuring position according to claim 1, wherein the at least one test probe is rotatably seated relative to the carrier via a means for providing a hinge.

7. Measuring position according to claim 1, wherein the measuring position comprises a plurality of test probes and wherein the test probes are chronologically movable in arbitrary combinations.

8. Measuring position according to claim 1, wherein the measuring position further comprises a means for direct testing of a semiconductor component within a microwave circuit of the microwave component.

9. Measuring position according to claim 1, wherein the at least one test probe has a multi-conductor structure.

10. Measuring position according to claim 1, wherein the measuring position further comprises a network integrated into the at least one test probe.

11. Measuring position for a microwave component, having a carrier for the microwave component and at least one test probe for contacting the microwave component, comprising a spatial position of the at least one test probe relative to a spatial position of the carrier being variable and adjustable in three spatial dimensions; the at least one test probe being a coaxial line having at least a coaxial outer conductor which presses against the carrier; and the at least one test probe being rotatably seated relative to the carrier via means for providing a hinge.

12. Measuring position according to claim 11, wherein the spatial position of the carrier is variable and adjustable in three spatial dimensions.

13. Measuring position according to claim 11, wherein the at least one test probe has a structure for exerting mechanical pressure onto the microwave component.

* * * * *